(12) United States Patent
Dieckmann

(10) Patent No.: US 6,985,218 B2
(45) Date of Patent: Jan. 10, 2006

(54) METHOD OF DETERMINING AT LEAST ONE PARAMETER THAT IS CHARACTERISTIC OF THE ANGULAR DISTRIBUTION OF LIGHT ILLUMINATING AN OBJECT IN A PROJECTION EXPOSURE APPARATUS

(75) Inventor: Nils Dieckmann, Hüttlingen (DE)

(73) Assignee: Carl Zeiss SMT AG (DE)

( * ) Notice: Subject to any disclaimer, the term of this patent is extended or adjusted under 35 U.S.C. 154(b) by 15 days.

(21) Appl. No.: 10/855,252

(22) Filed: May 27, 2004

(65) Prior Publication Data

US 2004/0257559 A1 Dec. 23, 2004

Related U.S. Application Data

(63) Continuation of application No. PCT/EP02/13430, filed on Nov. 28, 2002.

(30) Foreign Application Priority Data

Nov. 30, 2001 (DE) .......................................... 101 58 921

(51) Int. Cl.
*G01J 1/00* (2006.01)

(52) U.S. Cl. ..................................................... 356/121
(58) Field of Classification Search .................. 356/121
See application file for complete search history.

(56) References Cited

U.S. PATENT DOCUMENTS

| | | | |
|---|---|---|---|
| 5,863,712 A | 1/1999 | Von Bunau et al. | ........ 430/396 |
| 6,084,655 A | 7/2000 | Suzuki et al. | .................. 355/53 |
| 6,128,068 A | 10/2000 | Suzuki et al. | .................. 355/53 |
| 6,285,443 B1 | 9/2001 | Wangler et al. | ................ 355/87 |
| 6,333,777 B1 | 12/2001 | Sato | ............................ 355/53 |
| 6,741,394 B1 | 5/2004 | Tanitsu et al. | .............. 359/619 |
| 6,768,546 B2 * | 7/2004 | Sato | ........................... 356/399 |

FOREIGN PATENT DOCUMENTS

| | | |
|---|---|---|
| DE | 10062579 | 6/2001 |
| JP | 11087232 | 3/1999 |

OTHER PUBLICATIONS

Copy of "Technische Optik" by G. Schröder,Vogel Buchverlag Würzburg, 1987, ISBN–3–8023–0067–X, pp. 62–66.
Remarks by Applicant relating to the relevance of the reference, "Technische Optik".
Copy of International Search Report dated Sep. 29, 2003.

\* cited by examiner

*Primary Examiner*—F. L. Evans
(74) *Attorney, Agent, or Firm*—Young & Basile, P.C.

(57) ABSTRACT

A method of determining at least one parameter that is characteristic of the angular distribution of light illuminating an object in a projection exposure apparatus is described. This parameter may be, for example, a pupil asymmetry. The method comprises the step of inserting a filter element in or in close proximity of a pupil plane of an illumination system that is arranged between a light source and the object. The filter element has a filter function that varies in an azimuthal direction with respect to the optical axis of the illumination system. Then the intensity of the light in a plane downstream of the pupil plane is measured. After rotating the filter element around the optical axis by an angle $\Phi$, the measurement of the intensity is repeated. From the filter function, the angle $\Phi$ and the measured intensities the parameter is measured.

2 Claims, 4 Drawing Sheets

METHOD OF DETERMINING AT LEAST ONE PARAMETER THAT IS CHARACTERISTIC OF THE ANGULAR DISTRIBUTION OF LIGHT ILLUMINATING AN OBJECT IN A PROJECTION EXPOSURE APPARATUS

CROSS-REFERENCE TO RELATED APPLICATIONS

This application is a continuation of International Application PCT/EP02/13430, with an international filing date of Nov. 28, 2002, whose contents is incorporated herein by reference.

BACKGROUND OF THE INVENTION

1. Field of the Invention

The present invention relates to a method of determining at least one parameter that is characteristic of the angular distribution of light illuminating an object in a projection exposure apparatus.

2. Description of Related Art

To achieve an optimum projection result in a projection exposure apparatus, it is important that all structural directions of an object to be projected, in particular its horizontal and vertical structures, are imaged with optimum contrast. Such optimum contrast may not be achieved if the illumination of a pupil plane in the illuminating system deviates from its specified values, for example because it is asymmetrical and in particular astigmatic.

To be able to determine the projection quality of a projection exposure apparatus, the determination of the degree of homogeneity of the illumination of the pupil plane of the illuminating system is therefore necessary. This is a parameter that is characteristic of the angular distribution of the light illuminating the object to be projected.

According to a method known from commercially available products it is known to determine this parameter in that the illumination geometry is changed by inserting apertures in the beam path of the light source. Such a method is time-consuming.

SUMMARY OF THE INVENTION

It is therefore an object of the present invention to simplify the determination of the parameter that is characteristic of the angular distribution of the light illuminating an object in a projection exposure apparatus.

According to the invention, this object is achieved by a method comprising the following steps:

a) insertion of a filter element in or in close proximity of a pupil plane of an illumination system arranged between a light source and the object, said filter element having a filter function that varies in an azimuthal direction with respect to the optical axis of the illumination system;

b) measurement of the intensity of the light in a plane downstream of the pupil plane;

c) rotation of the filter element around the optical axis by an angle $\Phi$;

d) re-measurement of the intensity of the light in a plane downstream of the pupil plane, e) calculation of the at least one parameter from the filter function, the angle $\Phi$ and the intensities measured in steps b) and d).

In the simplest embodiment, a single rotation step and two integral intensity measurements are sufficient for the determination of the parameter. This method allows one to determine the pupil asymmetry, which is characteristic of the angular distribution of the light and is a suitable quantity for determining deviations from an ideal illumination. Such an ideal illumination may be, for example, a directionally independent illumination.

The new method can be performed rapidly, which accelerates the adjustment of the projection exposure apparatus and thereby increases its throughput.

The filter element may be rotated by different angles $\Phi$, and the step e) is then performed for each of these angles $\Phi$.

Depending on the requirements imposed on the precision of the determination of the angular distribution of the light, the filter function of the filter element and the number of rotational steps can be adapted for the refined determination of the parameter.

This refined parameter measurement results in a precise determination of the angular distribution of the illumination, which is advantageous for the projection of objects of complicated shape.

BRIEF DESCRIPTION OF THE DRAWINGS

Various features and advantages of the present invention may be more readily understood with reference to the following detailed description taken in conjunction with the accompanying drawing in which:

FIG. 6 shows a diagram of the integral intensity (I) measured with an intensity detector as a function of the angle of rotation $\phi$ of the pupil filter.

DESCRIPTION OF PREFERRED EMBODIMENTS

Figure 1:
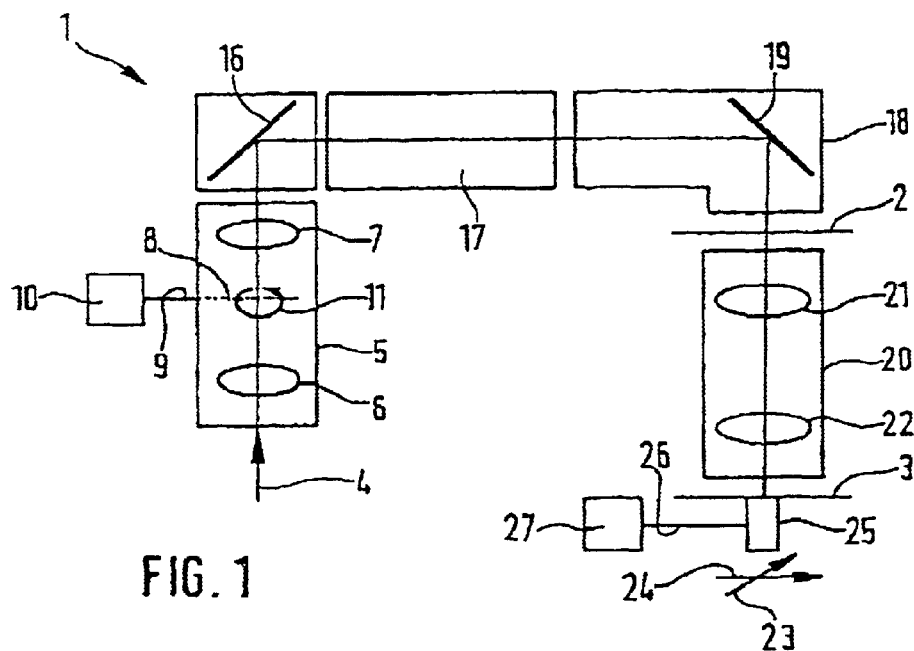
FIG. 1 shows a diagrammatic overview of a projection exposure apparatus for microlithography.

A projection exposure apparatus denoted in its entirety by 1 in FIG. 1 and shown diagrammatically therein is used to transfer a structure of a mask 2 onto a wafer 3. The basic structure of an illumination system of the projection exposure apparatus 1 is described in U.S. Pat. No. 6,285,443 which is incorporated therein by reference; therefore this illumination system is explained below with reference to FIG. 1 only to the extent necessary for the comprehension of the present invention.

Upstream of the illumination components in FIG. 1 a light source, not shown, for example a laser, is arranged that emits a projection light beam that is indicated in FIG. 1 by an arrow 4. An illumination lens 5 is used to shape the projection light beam 4 for a first time. The illumination lens 5 comprises a multiplicity of optical components, of which two biconvex lenses 6, 7 are shown in FIG. 1 by way of example.

Disposed in a pupil plane of the illumination lens 5 is a pupil filter 8 that is indicated in FIG. 1 by a broken line and that is linked to an actuator 10 by means of a diagrammatically indicated rod 9. Thus the pupil filter 8 can be rotated by a motor around the optical axis of the illumination lens 5, as is indicated by an arrow 11. Starting from a predetermined initial orientation of the pupil filter 8, the rotation is characterized by an angle of rotation Φ.

Figure 2:
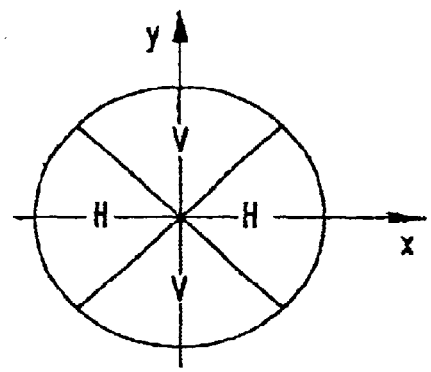
FIG. 2 shows a section, divided into quadrants, through the unobstructed aperture of an illuminating system of the projection exposure apparatus in a pupil plane of the latter.

A parameter characterizing the imaging quality of the illumination lens 5 is the pupil asymmetry ε inside the illumination lens 5. To define said pupil asymmetry ε, the pupil plane of the illumination lens 5 that the projection light beam 4 passes through is divided into four quadrants (cf. FIG. 2). In FIG. 2, the pupil plane is spanned by the Cartesian coordinate system of the projection exposure apparatus having the axes x, y. The pupil plane is divided into quadrants in such a way that the quadrants are each halved into two equally large sectors by the x- and y-axes, respectively. The two quadrants H halved by the x-axis are described below as horizontal quadrants and the quadrants V halved by the y-axis are described below as vertical quadrants. The pupil asymmetry ε is defined as the ratio of the intensities I of the components of the projection light beam 4 passing through the horizontal quadrants H and the vertical quadrants V. This can be written as:

$$\epsilon = I(H)/I(V) \quad (1)$$

Figure 3:
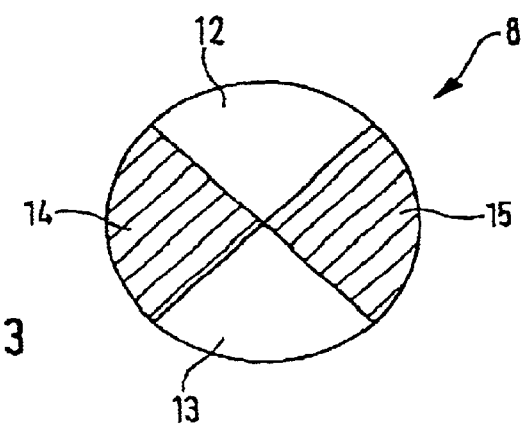
FIG. 3 shows a pupil filter disposed in the pupil plane of FIG. 2.

FIG. 3 illustrates the filter function of the pupil filter 8. For its part, the pupil filter 8 is divided into four quadrants, the two upper and lower transmitting quadrants 12, 13 that are mutually opposite in FIG. 3 transmitting the components of the projection light beam 4 that are incident upon them virtually completely, that is to say they have a transmission in the region of 100%. The two remaining right and left attenuating quadrants 14, 15 that are mutually opposite in FIG. 3 have a transmission in the region of 90% for the components of the projection light beam 4 that are incident upon them. The pupil filter 8 consequently has a filter function varying in the azimuthal direction with respect to the optical axis of the illuminating system. The attenuating quadrants may be designed as grey filter regions or as partially reflecting regions.

After passing through the illumination lens 5, the projection light beam 4 is deflected through 90° by a flat deflecting mirror 16 (cf. FIG. 1) and coupled into the left-hand end face of a glass-rod arrangement 17 by means of a coupling-in system not shown in FIG. 1. The glass-rod arrangement 17 is used to homogenize the projection light beam 4, as is described, for example in U.S. Pat. No. 6,285,443 mentioned above. After passing through the glass-rod arrangement 17, the projection light beam 4 enters a downstream lens 18 and is deflected through 90° by a deflecting mirror 19 contained in the latter onto the mask 2 in order to illuminate it.

A projecting lens 20, which likewise contains a multiplicity of optical components, of which two biconvex lenses 21, 22 are diagrammatically shown in FIG. 1, images the mask 2 on the wafer 3.

In the measurement configuration, shown in FIG. 1, of the projection exposure apparatus 1, an intensity detector 25 is disposed in the plane of the wafer 3 and can be displaced therein in two mutually perpendicular directions (cf. arrows 23, 24 in FIG. 1). Said intensity detector is connected to a computer 27 via a signal line 26. The displacement of the intensity detector 25 makes possible positionally resolved measurements.

Figure 4:
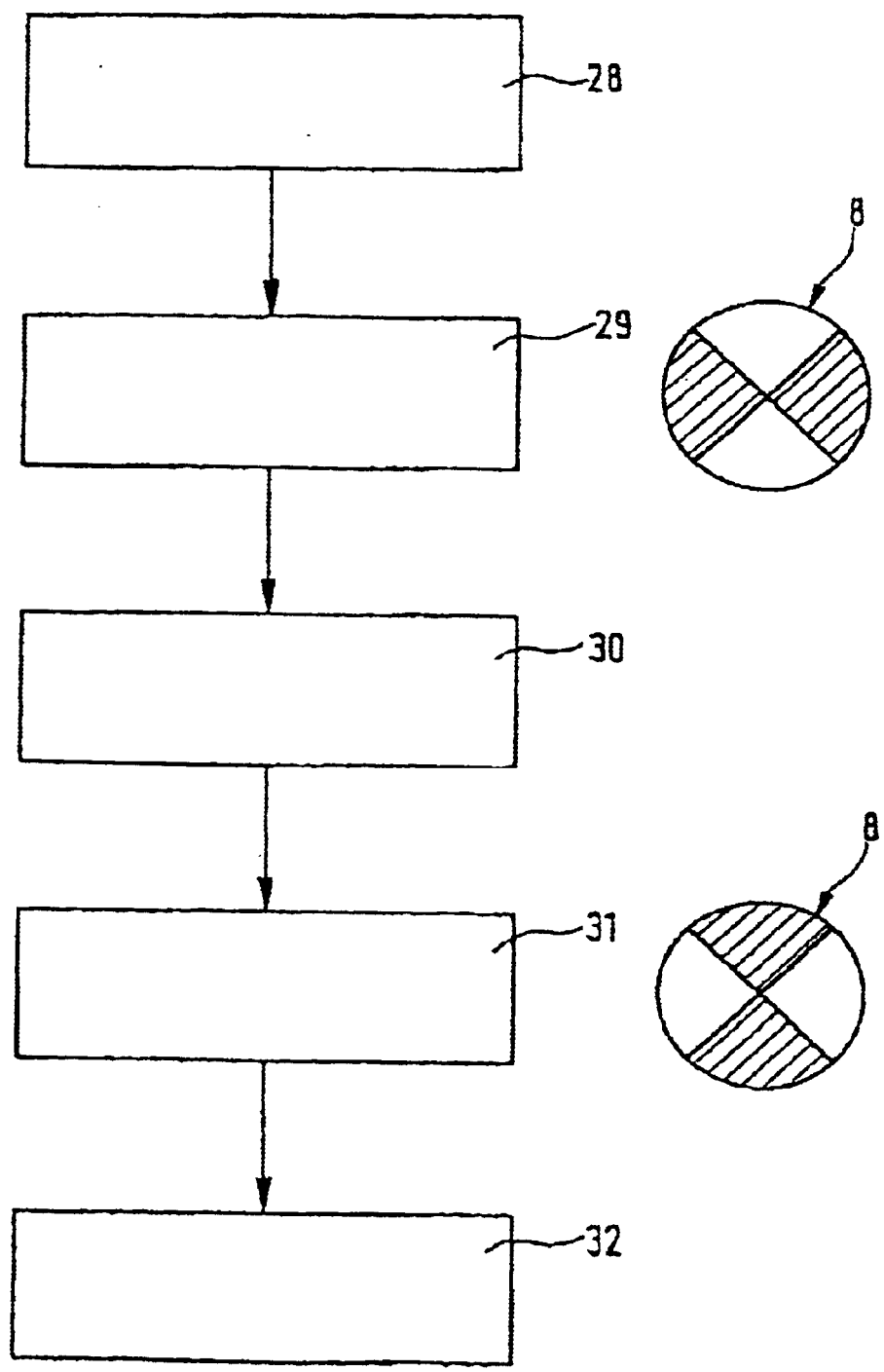
FIG. 4 shows a flowchart of a method of determining the pupil asymmetry of the illumination of the projection exposure apparatus.

A method of determining the pupil asymmetry ε is now explained with reference to FIG. 4 as an example of a parameter characterizing the angular distribution of illumination of the projection light beam 4 in the plane of the wafer 3:

First, in a preparatory step 28, the pupil filter 8 is inserted into the illumination lens 5 and linked to the actuator 10 by means of the rod 9. The pupil filter 8 may also be permanently present in the illumination lens 5. In a first measurement position of the pupil filter 8, in which the transmitting quadrants 12, 13 are aligned in such a way that they completely cover the vertical quadrants V, the integral intensity of the projection light beam 4 is then measured in the plane of the wafer by means of the intensity detector 25. This takes place in a measurement step 29.

The integral intensity $I_1$ measured in the measurement step 29 can be expressed as follows:

$$I_1 = T(TQ)I(V) - T(AQ)I(H). \quad (2)$$

Here, I(V), I(H) are the intensity components, defined in connection with formula (1), in the pupil plane of the illumination lens 5. T(TQ) is the transmission of the transmitting quadrants 12, 13. T(AQ) is the transmission of the attenuating quadrants 14, 15.

In a rotation step 30, the pupil filter 8 is then rotated through 90° around the optical axis of the illumination lens 5 by actuating the actuator 10. In this position, in a measurement step 31, the integral intensity of the projection light beam 4 is once more measured in the plane of the wafer with the aid of the intensity detector 25. This second intensity, $I_2$, can be written as:

$$I_2 = T(AQ)I(V) + T(TQ)I(H). \quad (3)$$

The pupil asymmetry Φ is then calculated from the measured values $I_1$, $I_2$ in an evaluation/calculation step 32. This yields as intermediate variables:

$$I(H) = (T(AQ)I_1 - T(TQ)I_2)/(T(AQ)^2 - T(TQ)^2) \quad (4)$$

and $$I(V) = (T(AQ)I_2 - T(TQ)I_1)/(T(AQ)^2 T(TQ)^2) \quad (5)$$

Substitution in (1) yields the pupil asymmetry ε.

The pupil asymmetry ε is a direct measure of the angular distribution of the projection light beam 4 in the plane of the wafer.

The method described above can be refined further by repeatedly measuring the integral intensity in the plane of the wafer at various measurement positions of the pupil filter 8. For example, the pupil asymmetry ε may be determined not only in regard to a fixed laboratory coordinate system (cf. xy coordinate system in FIG. 2), but that (if any) coordinate system x'y' rotated with respect to the fixed laboratory system may be determined in which the pupil asymmetry ε deviates the most from the value 1.

A method of doing this is explained below with reference to FIG. 5. Steps in the method or components of the projection exposure apparatus that correspond to those that have already been described with reference to FIGS. 1 to 4 have reference numerals increased by 100 and are not explained in detail yet again.

Figure 5:
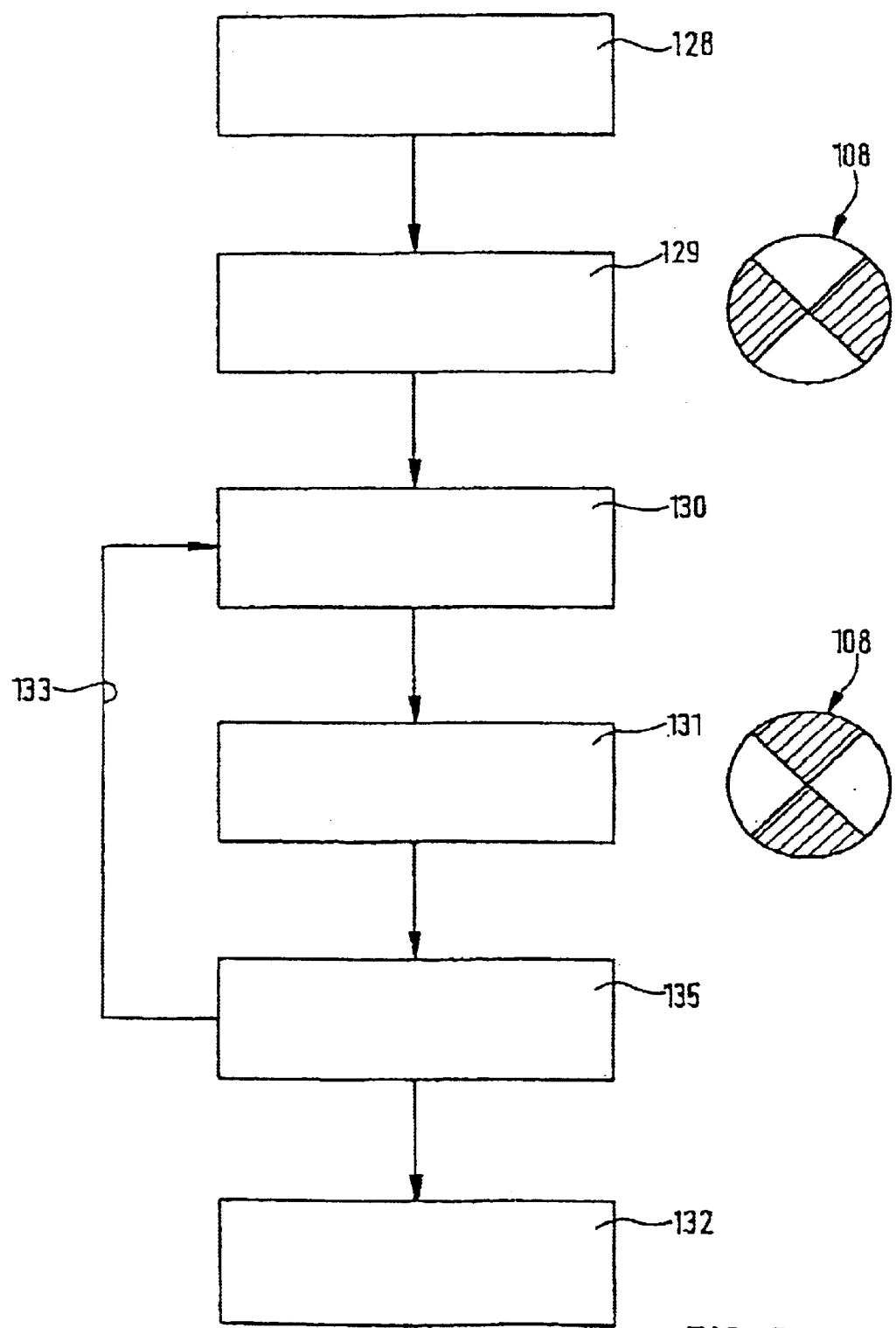
FIG. 5 shows a flowchart of a method of determining the pupil asymmetry according to another embodiment.

In the method in accordance with FIG. 5, the pupil filter 108 is not rotated through 90° in the rotation step 130, but is initially rotated to a first of a multiplicity of incremental measurement positions that differ by a smaller angle of rotation, for example 10°. The pupil filter 108 is stopped at the individual measurement positions and the integral intensity is measured in each measurement position by repeatedly executing the steps 130 and 131, the integral intensity measured in every measurement position being temporarily stored in a storage step 135. This repeated execution is represented by the arrow 133 in FIG. 5.

Figure 6:
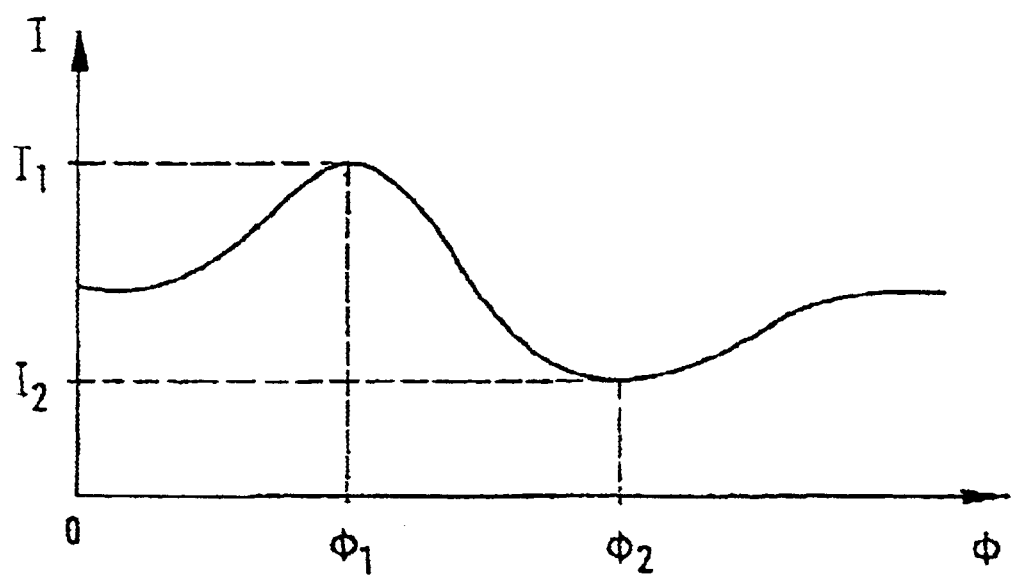
FIG. 6 shows diagrammatically the dependence of an intensity, which is measured in a wafer plane of the projection exposure apparatus in accordance with FIG. 1, on the angle of rotation of the pupil filter shown in FIG. 3 around the optical axis of the illuminating system.

A result of such a measurement sequence is shown diagrammatically in FIG. 6. In the latter, the integral intensity I measured with the intensity detector 125 is shown as a function of the angle of rotation Φ of the pupil filter 108. Because of the mirror symmetry of the filter function of the pupil filter 108, rotation in an angular range of between 0 and 180° is sufficient. The continuous line in the I/Φ diagram of FIG. 6 is an idealized measurement result that is temporarily stored after the storage steps 135.

The maximum $I_1$ of the measured I/Φ curve as well as its minimum $I_2$ as well as the associated angular positions $\Phi_1$, $\Phi_2$ are determined in the course of an, in this case, expanded evaluation/calculation step 132. Not only the maximum pupil asymmetry ε can be determined from these extreme values as well as the associated angular positions, but also the angular position of the corresponding quadrants H', V' in the pupil plane having minimum and maximum transmitted intensity in the coordinate system x', y' defined by the angular positions $\Phi_1$, $\Phi_2$.

The division of the pupil filters 8, 108 into quadrants results in a simple determination of the pupil asymmetry ε, as shown above. If the intensity distribution of the projection light beam 4 in the pupil plane of the illumination lens 5 is to be determined in greater detail, for example, using the measurement sequence explained within the framework of the discussion of FIGS. 5 and 6, the pupil filter 8, 108 may also have another filter function. The transmitting regions (cf. transmitting quadrants 12, 13) may, for example, be designed as transmitting sectors having a sector angle differing from 90°, for example a smaller sector angle or having a number of sectors differing from four. Further details of the intensity distribution of the projection light beam 4 in the pupil plane of the illumination lens 5 can be measured by a filter function of the pupil filter 8, 108 having a radial dependence of the transmission using appropriately adapted algorithms in the calculation step 32, 132.

It goes without saying that the transmission values in the transmitting quadrants 12, 13, on the one hand, and the attenuating quadrants 14, 15, on the other, may also assume values other than 100% or 90%, respectively. The decisive factor is that the transmissions in the transmitting quadrants 12, 13, on the one hand, and the attenuation quadrants 14, 15, on the other, differ sufficiently for the parameter determination.

What is claimed is:

1. A method of determining at least one parameter that is characteristic of the angular distribution of light illuminating an object in a projection exposure apparatus, said method comprising the following steps:
   a) insertion of a filter element in or in close proximity of a pupil plane of an illumination system arranged between a light source and the object, said filter element having a filter function that varies in an azimuthal direction with respect to the optical axis of the illumination system;
   b) measurement of the intensity of the light in a plane downstream of the pupil plane;
   c) rotation of the filter element around the optical axis by an angle Φ;
   d) re-measurement of the intensity of the light in a plane downstream of the pupil plane,
   e) calculation of the at least one parameter from the filter function, the angle Φ and the intensities measured in steps b) and d).

2. The method of claim 1, wherein the filter element is rotated by different angles Φ, and wherein the step e) is performed for each of these angles Φ.

* * * * *